United States Patent
Lee et al.

(10) Patent No.: US 11,435,398 B2
(45) Date of Patent: Sep. 6, 2022

(54) REAL TIME CHUCK TEMPERATURE MONITORING

(71) Applicant: Texas Instruments Incorporated, Dallas, TX (US)

(72) Inventors: Guan Da Lee, Melaka (MY); Adi Irwan Herman, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/113,914

(22) Filed: Dec. 7, 2020

(65) Prior Publication Data

US 2022/0178993 A1 Jun. 9, 2022

(51) Int. Cl.
*G01R 31/28* (2006.01)
*G01J 5/00* (2022.01)

(52) U.S. Cl.
CPC ........ *G01R 31/2891* (2013.01); *G01J 5/0007* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | |
|---|---|---|---|
| 2007/0132467 A1 | 6/2007 | Jager | |
| 2008/0018352 A1* | 1/2008 | Chiba | G01R 31/2865 324/750.04 |
| 2012/0234528 A1* | 9/2012 | Hatta | H01L 21/67248 165/287 |
| 2017/0292832 A1 | 10/2017 | Penjovic et al. | |
| 2020/0235057 A1 | 7/2020 | Hud et al. | |

FOREIGN PATENT DOCUMENTS

KR 940004771 8/1993

OTHER PUBLICATIONS

"MLX90616ESF-HCA infra Red Thermometer in TO-39 for high temperature thermometer guns" Melexis Microelectronic Integrated Systems, 3901090616 Rev 002, Data Sheet, Aug. 20, 2012, 36 pages.
PCT Search Report App No. PCT/US 2021/061928, dated Mar. 10, 2022, 2 pages.

* cited by examiner

*Primary Examiner* — Tung X Nguyen
(74) *Attorney, Agent, or Firm* — Ronald O. Neerings; Charles A. Brill; Frank D. Cimino

(57) ABSTRACT

A wafer probe test system includes a chuck to support a wafer, and a probe card having a first side to face the chuck, an opposite second side, and an aperture that extends between the first and second sides. The system also includes a probe head mounted to the first side of the probe card and having probe pins to contact a device under test of the wafer, and an infra-red thermal sensor facing the aperture of the probe card to sense a temperature of the wafer.

20 Claims, 4 Drawing Sheets

REAL TIME CHUCK TEMPERATURE MONITORING

BACKGROUND

Wafer probe testing is an automated test performed on circuitry of prospective die areas or devices under test (DUTs) of a processed semiconductor wafer. A wafer probe test system or wafer prober includes a probe head that successively connects to a DUT of a tested wafer, and the system applies signals of a test pattern to the DUT circuitry to evaluate performance. Some device circuits, such as automotive grade temperature sensors are trimmed or otherwise programmed or configured using the prober chuck temperature as a reference point. In practice, the chuck can be calibrated, and its temperature can be set between wafer lots. However, the chuck temperature can vary during lot testing, and the chuck temperature may not be uniform across the area of a tested wafer. Moreover, calibration is typically only done before a wafer is tested, and as such any drifts in temperature will not be detected during testing. As a result, temperature trimming can be incorrect from die to die and/or from wafer to wafer, leading to low yield and potentially scrapping entire wafers due to mistrimming.

SUMMARY

A wafer probe test system is provided according to one aspect, which includes a chuck, a probe card with a probe head, and one or more infra-red (IR) thermal sensors. The probe card has an aperture spaced from the probe head, and the IR thermal sensor faces the aperture of the probe card to sense the temperature of the wafer. In a further aspect, a probe card has opposite first and second sides, and an aperture that extends along a first direction between the first and second sides. A probe head is mounted to the first side of the probe card, spaced apart from the aperture along a second direction, and the probe card include an infra-red thermal sensor facing the aperture. In a further aspect, a method includes testing a device under test (DUT) of a wafer using a probe head of a probe card, sensing a temperature of the wafer through an aperture of the probe card using an infra-red thermal sensor, separating dies from the wafer, attaching one of the dies to a die attach pad or a substrate, and performing a molding process that creates a molded structure that encloses a portion of the one of the dies.

DETAILED DESCRIPTION

Figure 1:
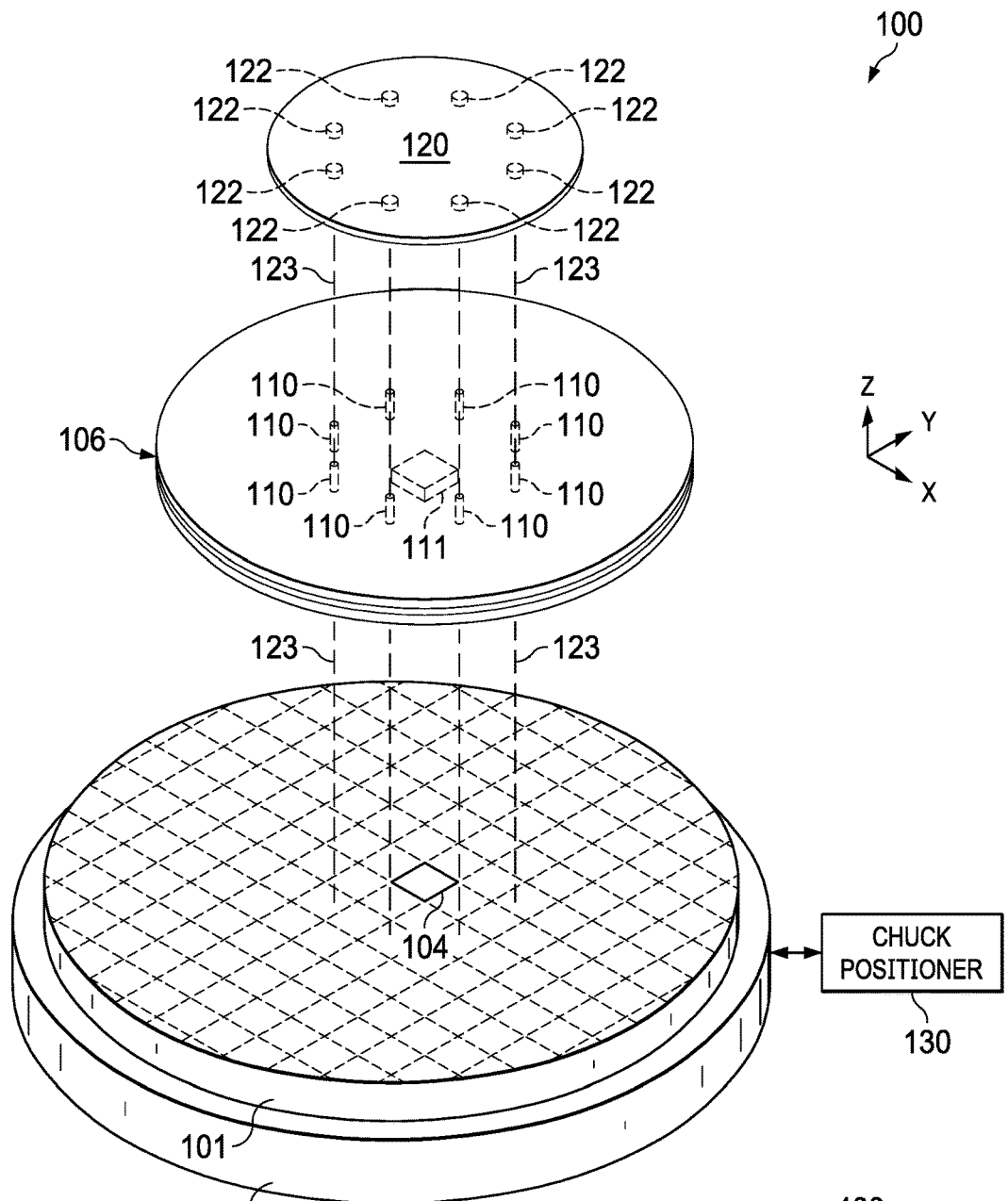
FIG. 1 is a perspective view of a portion of a wafer probe test system with infra-red thermal sensors to sense a tested wafer temperature.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
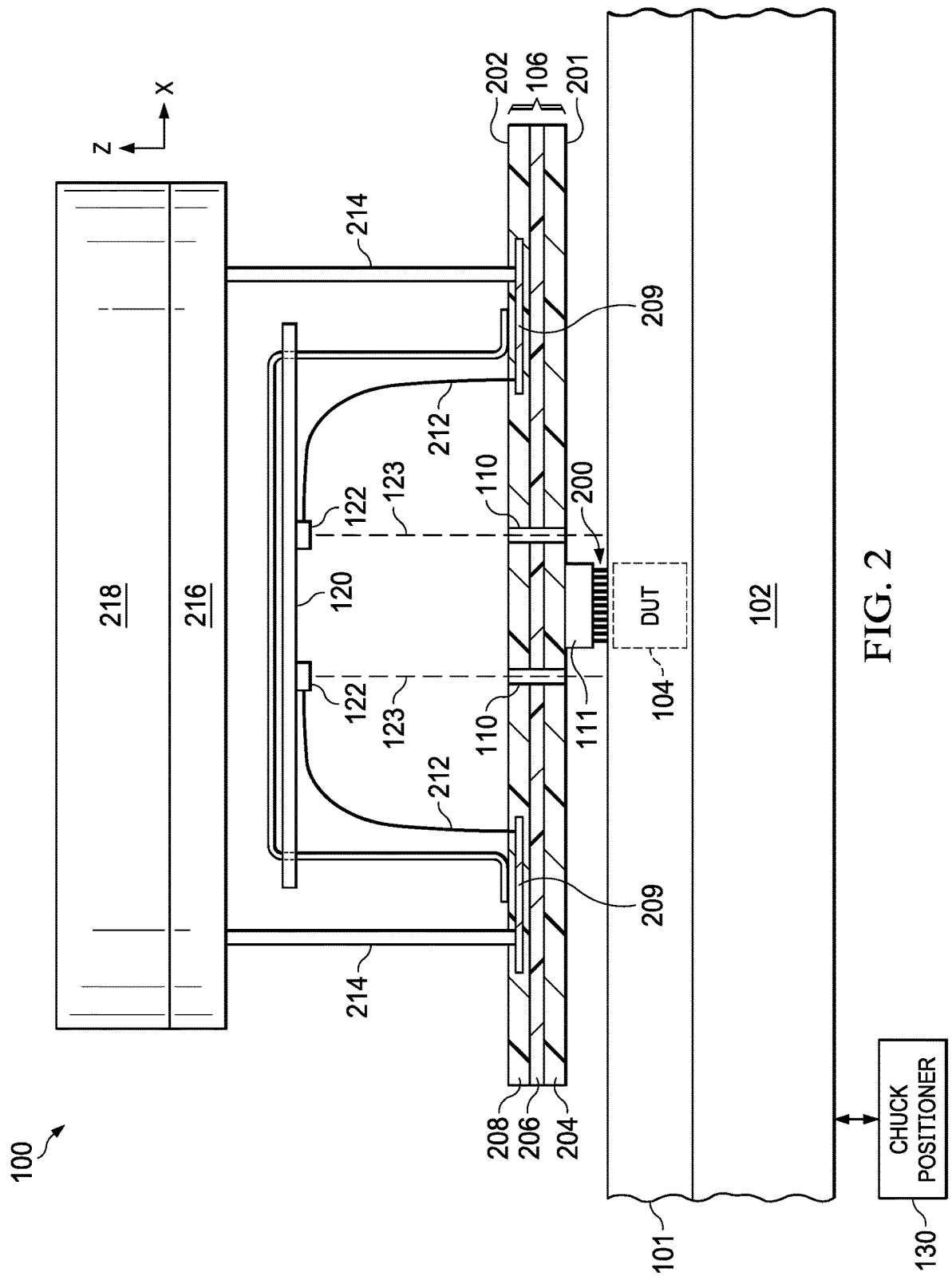
FIG. 2 is a side elevation view of the wafer probe test system of FIG. 1.

Referring initially to FIGS. 1 and 2, FIG. 1 shows a perspective view of a portion of a wafer probe test system 100, and FIG. 2 shows a side view of the system 100. The system 100 includes apparatus to install and handle a tested wafer 101 in a wafer chuck 102 for wafer-level electrical testing of one or more die locations that correspond to individual prospective dies with associated electronic circuitry. The chuck 102 is adapted or otherwise configured to support the wafer 101 during repositioning and testing. In operation in one example, the wafer 101 is held in position by a vacuum feature of the chuck 102 (not shown) and the chuck is positioned to support a selected device under test (DUT) 104 of the wafer 101 relative to a probe card 106.

The wafer probe test system 100 provides contactless, real-time infra-red (IR) temperature sensing to sense the temperature of a tested wafer to facilitate reduced chance of incorrectly trimmed dies, improved product yield, improved overall equipment effectiveness (OEE) and reduced cost during manufacturing of integrated circuits (ICs) and other packaged electronic devices. Real-time wafer temperature monitoring also facilitates the ability to interrupt or discontinue testing if the wafer temperature falls outside an acceptance range, for example, to allow recalibration of the wafer chuck 102 to bring the chuck and wafer temperatures within a predetermined or user configurable acceptance range before resuming wafer probe testing.

The probe card 106 in one example is a single or multi-layer printed circuit board (PCB) having a substrate with electrical contacts or solder pads, circuit components soldered to the contacts, and conductive vias and conductive traces for routing electrical signals. The probe card 106 includes one or more apertures 110 that extend along a first direction (Z). The apertures 110 in this example laterally encircle a probe head 111 mounted to the bottom of the probe card 106. The wafer probe test system 100 in FIGS. 1 and 2 includes a handle 120 that is mounted to the probe card 106, and IR thermal sensors 122 are mounted to the handle 120. The IR thermal sensors each have a downwardly facing sensing side or sensing face that detects the temperature along a corresponding sensing path 123 that extends through a respective one of the apertures 110 of the probe card 106. In this example, the IR thermal sensors 122 collectively sense the temperature of the wafer 101 at locations that surround a tested DUT portion 104 of the wafer 101. In another example, a single IR thermal sensor 122 is used to sense the temperature of the wafer 101 through a single aperture 110. In a further example, the wafer probe test system 100 has an integer number N IR thermal sensors 122 and N respective apertures 110, where N is 2 or more.

The wafer probe test system 100 also includes a chuck positioner 130. In one example, the chuck positioner 130 is a 3-axis position controller that is operatively coupled to the chuck 102. As further shown in FIG. 2, the probe head 111 includes one or more conductive probe pins 200 configured to contact the device under test DUT 104 of the wafer 101 when the chuck 102 is positioned to a suitable location beneath the probe card 106. In one example, the probe pins 200 are spring loaded or fixed copper or aluminum pins that mechanically engage to, and form electrical connections to, conductive features on the top side of the processed wafer 101. The chuck positioner 130 controls a relative position of the chuck 102 and the probe card 106 to engage the conductive probe pins 200 of the probe head 111 to conductive features of the wafer 101 of the selected DUT 104. In another example, a positioner is operatively coupled to probe card 106 to control the relative positions of the probe card 106 and the chuck 102. In another example, a positioner is operatively coupled to both the probe card 106 and the chuck 102 to control the relative positions of the probe card 106 and the chuck 102. The chuck positioner 130 in one example includes mechanical actuators, robotic arms, or the like in order to control the relative positions of the probe card 106 and the chuck 102 in three dimensional space (e.g., along the X, Y and/or Z directions in the drawings).

The probe card 106 in this example includes a first (e.g., lower) side 201 and a second (e.g., upper) side 202 spaced apart from the first side 201 along the first direction. The first side 201 is configured to face the chuck 102 during operation, and the apertures 110 extends along the first direction Z between the respective first and second sides 201 and 202. The probe head 111 is mounted to the first side 201 of the probe card 106. The probe head 111 is laterally spaced apart from the apertures 110 along a second direction (e.g., the X direction in FIG. 2, or more generally in the X-Y plane in the perspective view of FIG. 1), where the second direction is orthogonal to the first direction Z. The sensing faces or sensing sides of the IR thermal sensors 122 face the respective apertures 110 of the probe card 106 and the IR thermal sensors 122 operate to sense the temperature of the wafer 101. In one example, the sensing faces or sensing sides of the IR thermal sensors 122 face the respective apertures 110 of the probe card 106 and the IR thermal sensors 122 operate to sense the temperature of the wafer 101 along sensing paths 123 that are parallel to the first direction (Z). In another example, the sensing faces or sensing sides of the IR thermal sensors 122 face the respective apertures 110 of the probe card 106 and sense the temperature of the wafer 101 along sensing paths 123 that are not parallel to the first direction, for example, at an angle up to about 60 degree to the first direction.

In the example of FIGS. 1 and 2, the probe card 106 includes eight apertures 110, in which each aperture 110 extends along the first direction between the respective first and second sides 201 and 202 of the probe card 106. In this example, each aperture 110 is aligned with a respective one of the IR thermal sensors 122. In addition, the apertures 110 are each spaced apart from the probe head 111, and the apertures 110 encircle the probe head 111. In this configuration, the temperature readings of the IR thermal sensors 122 provide a measurement of the wafer temperature proximate the tested DUT 104. Similar benefits are provided in implementations using a single IR thermal sensor 122 and a corresponding single aperture 110. The wafer probe test system 100 in one example programs (e.g., trims) the tested DUT 104 according to the wafer temperature information from the IR thermal sensors 122 in response to determining that the wafer 101 is within an acceptance range. If the wafer temperature is not within the acceptance range, the testing is discontinued and the chuck 102 is recalibrated before resuming wafer probe testing of the DUT 104.

As shown in FIG. 2, the probe card 106 is a laminate structure having a bottom layer 204, a middle layer 206 and a top layer 208. The probe card 106 in one example includes traces 209 in or on the top layer 208. The traces 209 provide electrical connection between the IR thermal sensors 122 and a test system for real-time monitoring of the wafer temperature. The wafer probe test system 100 also includes a handle support that mounts the handle 120 to the second side 202 of the probe card 106. The IR thermal sensors 122 in this example are mounted to the bottom side of the handle 120 with the sensing sides facing the corresponding apertures 110 for thermal sensing of the temperature of the wafer 101 along the corresponding sensing paths 123. The wafer probe test system 100 further includes wires 212 coupled between individual ones of the IR thermal sensors 122 and the respective traces 209 of the probe card 106. The traces 209 in one example are electrically coupled to corresponding spring contact pins 214 by respective conductive contacts on the second side 202 of the probe card 106 to provide feedback from the IR thermal sensors 122 to a performance board 216. The wafer probe test system 100 also includes a test head 218.

Figure 3:
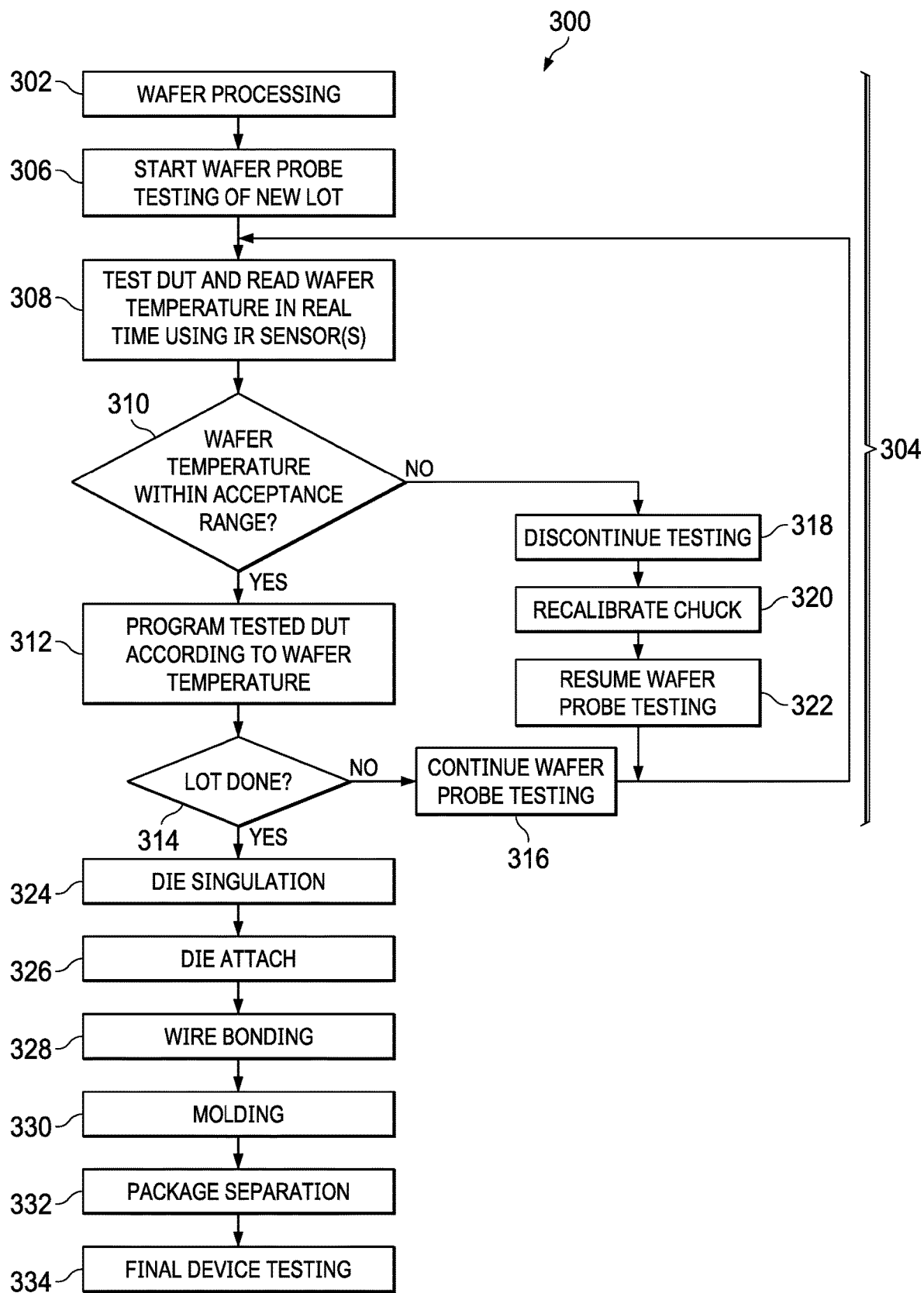
FIG. 3 is a flow diagram of a method for manufacturing packaged electronic devices with wafer probe testing and thermal trimming using IR thermal sensors.

FIG. 3 shows a method 300 for manufacturing packaged electronic devices, which has an included wafer probe test process and thermal trimming using IR thermal sensors. The method 300 includes processing a wafer at 302 to fabricate one or more electronic components (e.g., transistors, resistors, capacitors, diodes, etc.) and electrical circuits in each of multiple die areas of a starting semiconductor wafer (e.g., wafer 101 in FIGS. 1 and 2). The method 300 includes lot-based wafer probe testing at 304. Wafer probe testing of a new lot of wafers starts at 306. In one example, the wafer chuck 102 is brought within an acceptance range of a target temperature in a thermal calibration step at 306. In one example, the chuck 102 is brought to approximately 140 degrees C. with an acceptance range of +/−0.8 degrees C. in the thermal calibration step in order to characterize performance of the die areas of the lot of wafers at 306.

The method 300 continues at 308 with testing one or more DUTs of the first wafer in the lot using the probe head 111 of the probe card 106. The wafer probe testing at 308 in one example includes positioning the wafer (e.g., wafer 101 in the chuck 102 of FIGS. 1 and 2) beneath the probe card 106 such that conductive features of a selected die area of the wafer 101 (e.g., die area that includes the DUT 104 in FIGS. 1 and 2) is engaged by the conductive probe pins 200 of the probe head 111. With the selected DUT 104 engaged to the probe card 106, the wafer probe test system 100 performs one or more electrical tests automatically by generating and applying voltage and/or current test signals to the DUT 104 and measuring responsive electrical signals to characterize one or more performance metrics of the selected DUT 104. While the selected DUT 104 is engaged to the probe card 106, the IR thermal sensors 122 sense the temperature of the wafer 101 around the selected DUT 104 through the apertures 110 of the probe card 106. In one example, the wafer probe test system 100 senses the temperature of the wafer 101 through the apertures 110 of the probe card 106 using the infra-red IR thermal sensors 122 while testing the DUT 104 at 308. In one example, each of the IR thermal sensors 122 outputs a voltage signal that corresponds to the temperature the wafer DUT 104. The test probe system 100 is programmed with executable code that reads the correct path from the probe head 111 to obtain the voltage signals from the IR thermal sensors 122 at 308. The program code in one implementation links the IR thermal sensors 122 to the tester software, for example, using custom libraries.

The program code of the wafer probe test system 100 converts the obtained voltages into actual temperatures and evaluate whether this temperature is acceptable or not. In one example, the wafer probe test system 100 evaluates the signals from the IR thermal sensors 122 at 310 and determines whether the wafer temperature is within the acceptance range (e.g., 140 degrees C.+/−0.8 degrees C.). In response to the temperature of the wafer 101 being within the acceptance range (YES at 310), the wafer probe test system 100 in one example programs the DUT 104 at 312 according to the temperature of the wafer 101. In one example, the DUT 104 is formed in a prospective die of a thermal sensor product, and the wafer probe testing includes calibration data corresponding to performance of the DUT 104 within the acceptance range. In this example, the calibration data is stored in an electronic memory or register of the DUT 104 at 312.

At 314, the wafer probe test system 100 determines whether wafer probe testing of the current wafer lot has been completed. If not (NO at 314), a next selected DUT of the current wafer 101, or a selected die area of a next wafer 101 of the lot, is engaged to the conductive probe pins 200 of the probe card 106, and wafer probe testing continues at 316. The method 300 returns to 308 for testing of the next DUT 104 as described above.

In response to the temperature of the wafer 101 being outside an acceptance range (NO at 310), the wafer probe test system 100 discontinues testing of the DUT 104 at 318. The method 300 also includes recalibrating the wafer chuck 102, including bringing the chuck temperature to the acceptance range (e.g., 140 degrees C.+/−0.8 degrees C.) at 320. Wafer probe testing resumes at 322 and the method 300 returns to 308 for testing of the selected DUT 104 as described above. The wafer probe testing at 304 continues until all desired DUTs of the lot of wafer 101 have been tested and optionally programmed.

Once wafer probe testing of the wafer lot is completed (YES at 314), the method 300 continues with separating individual dies from the wafer 101 at 324, and attaching one of the dies to a die attach pad or a substrate at 326. Wire bonding is performed in one example at 328 to electrically couple bond pads of the attached die to lead frame conductive lead features. The method 300 continues at 330 with performing a molding process that creates a molded structure that encloses a portion of the die. Package separation is performed at 332, such as sawing the molded structure and lead frame structure to provide singulated packaged electronic devices, and the separated devices are tested at 334.

Figure 4:
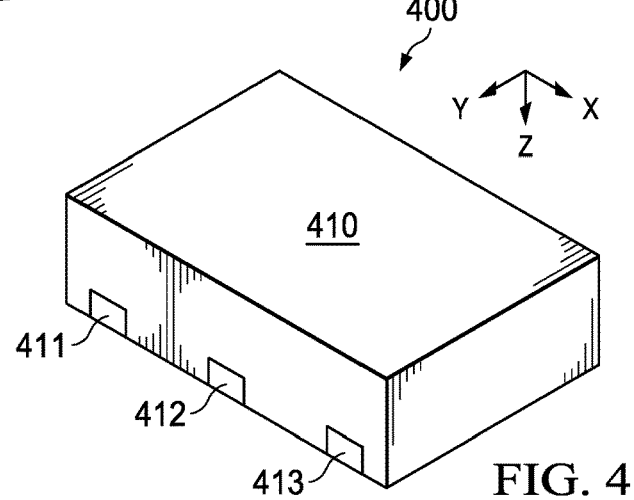
FIG. 4 is a perspective view of a packaged electronic device produced according to the method of FIG. 3.

FIG. 4 shows a packaged electronic device 400 manufactured according to the method 300 of FIG. 3. The packaged electronic device 400 includes a molded or ceramic package structure 410 with conductive leads 411, 412 and 413.

Figure 5:
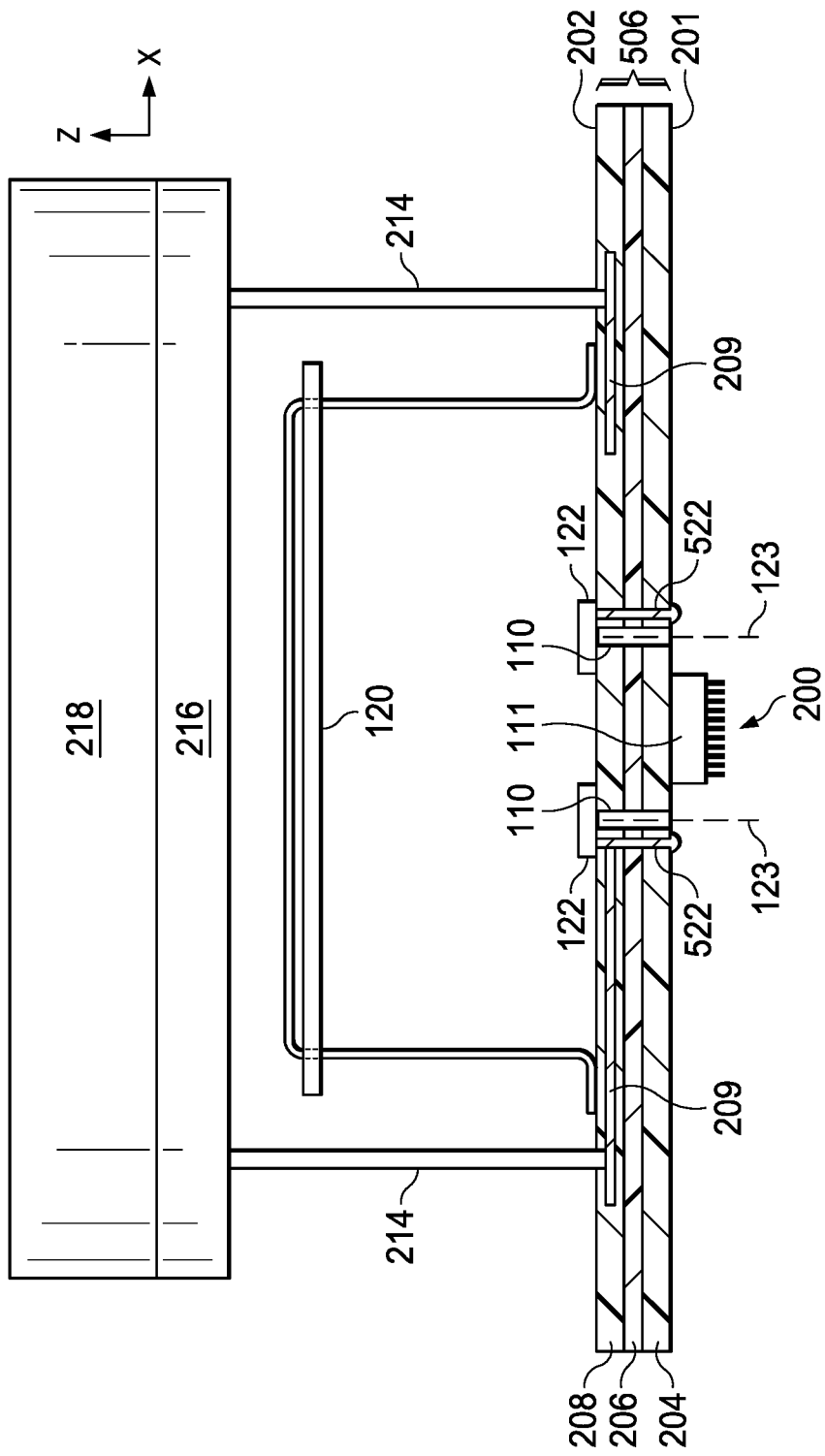
FIG. 5 is a side elevation view of another example wafer probe card and wafer probe test system.

FIG. 5 shows another example wafer probe card 506 in the wafer probe test system described above in connection with FIGS. 1 and 2. In one example, a handle is included as shown in FIG. 5. In another example, the handle is omitted. In this example, the IR thermal sensor or sensors 122 are mounted to the second side 202 of the probe card 506. In one implementation, the IR thermal sensors 122 are through-hole electronic devices or components with leads that extend into, and are soldered to, conductive vias or plated through holes of the probe card 506. The probe card 506 includes one or more traces 209 coupled to respective ones of the IR thermal sensors 122 to provide feedback from IR thermal sensor 122 to the performance board 116. In one example, the traces 209 are electrically coupled to plated through holes to make electrical connection with a terminal of the IR thermal sensor 122. The apertures 110 are aligned to expose the sensing side or sensing face of the IR thermal sensors 122 to sense the workpiece along the corresponding sensing paths 123 that extends through the respective apertures 110 of the probe card 506.

As in the example of FIGS. 1 and 2 above, the probe head 111 in FIG. 5 includes conductive probe pins 200 configured to contact a DUT. The probe card 506 includes opposite first and second sides 201 and 202 and the apertures 110 extends along the Z direction. The probe head 111 is mounted to the first side 201 and is laterally spaced apart from the apertures 110 along the orthogonal second direction (e.g., the X direction in FIG. 5). In different implementations, the probe card 506 has a single IR thermal sensor 122 and a corresponding single aperture 110 laterally spaced from the probe head 111. In another implementation, the probe card 506 includes multiple apertures 110 and corresponding IR thermal sensors 122, in which the apertures 110 are each spaced apart from the probe head 111, and the apertures 110 encircle the probe head 111. The probe card 506 in this example is a laminate structure with a bottom layer 204, a middle layer 206 and a top layer 208, and traces 209 in or on the top layer 208 that provide electrical connection between the IR thermal sensors 122 and the test system for real-time wafer temperature monitoring as discussed above.

The described examples facilitate accurate testing and programming of wafer DUTs, as well as real time triggering to discontinue wafer probe testing if the wafer falls outside a thermal acceptance range. This mitigates or avoids mis-trimming of tested wafers due to chuck temperature variance, where the integrated IR thermal sensors 122 allow detection in real time of any temperature drift on chuck 102 or the installed wafer 101. This capability facilitates improved production yield as thermal drifts can be discovered and used to discontinue testing for recalibration of the chuck 102, in contrast to existing methods that can only detect the drift at the beginning of a lot. In one implementation, the described system 100 and methods facilitate high accuracy (e.g., within less than 0.5 degrees C.), whereas conventional sensing of the chuck temperature only during calibration can only ensure temperature with a range greater than 0.5 degrees C. Moreover, the described apparatus and techniques provide greater trimming confidence by the use of multiple IR thermal sensors 122 in certain examples.

Modifications are possible in the described examples, and other implementations are possible, within the scope of the claims.

What is claimed is:

1. A wafer probe test system, comprising:
    a chuck configured to support a wafer;
    a probe card having a first side configured to face the chuck, an opposite second side, and an aperture that extends along a first direction between the first and second sides of the probe card;
    a probe head mounted to the first side of the probe card, the probe head being spaced apart from the aperture along a second direction, the second direction being orthogonal to the first direction, the probe head having probe pins configured to contact a device under test (DUT) of the wafer; and
    an infra-red thermal sensor facing the aperture of the probe card to sense a temperature of the wafer.

2. The wafer probe test system of claim 1, further comprising a handle mounted to the second side of the probe card, wherein the IR thermal sensor is mounted to the handle.

3. The wafer probe test system of claim 2, wherein the probe card includes a trace; further comprising a wire coupled between the IR thermal sensor and the trace to provide feedback from IR thermal sensor to a performance board.

4. The wafer probe test system of claim 1, wherein the IR thermal sensor is mounted to the second side of the probe card.

5. The wafer probe test system of claim 4, wherein the probe card includes a trace coupled to the IR thermal sensor to provide feedback from IR thermal sensor to a performance board.

6. The wafer probe test system of claim 1, comprising multiple IR thermal sensors, wherein:
the probe card includes multiple apertures, each aperture extending along the first direction between the first and second sides of the probe card, and each aperture being aligned with a respective one of the IR thermal sensors.

7. The wafer probe test system of claim 6, wherein:
the apertures are each spaced apart from the probe head; and
the apertures encircle the probe head.

8. A probe card, comprising
a first side;
an opposite second side;
an aperture that extends along a first direction between the first and second sides of the probe card;
a probe head mounted to the first side of the probe card, the probe head being spaced apart from the aperture along a second direction, the second direction being orthogonal to the first direction; and
an infra-red thermal sensor facing the aperture.

9. The probe card of claim 8, further comprising a handle mounted to the second side of the probe card, wherein the IR thermal sensor is mounted to the handle.

10. The probe card of claim 9, wherein the probe card includes a trace; further comprising a wire coupled between the IR thermal sensor and the trace to provide feedback from IR thermal sensor to a performance board.

11. The probe card of claim 8, wherein the IR thermal sensor is mounted to the second side of the probe card.

12. The probe card of claim 11, wherein the probe card includes a trace coupled to the IR thermal sensor to provide feedback from IR thermal sensor to a performance board.

13. The probe card of claim 8, comprising multiple IR thermal sensors, wherein:
the probe card includes multiple apertures, each aperture extending along the first direction between the first and second sides of the probe card, and each aperture being aligned with a respective one of the IR thermal sensors.

14. The probe card of claim 13, wherein:
the apertures are each spaced apart from the probe head; and
the apertures encircle the probe head.

15. A method of manufacturing a packaged electronic device, the method comprising:
testing a device under test (DUT) of a wafer using a probe head of a probe card;
sensing a temperature of the wafer through an aperture of the probe card using an infra-red thermal sensor;
separating dies from the wafer;
attaching one of the dies to a die attach pad or a substrate; and
performing a molding process that creates a molded structure that encloses a portion of the one of the dies.

16. The method of claim 15, further comprising:
in response to the temperature of the wafer being outside an acceptance range:
discontinuing testing of the DUT,
recalibrating a wafer chuck, and
resuming wafer probe testing.

17. The method of claim 16, comprising:
sensing the temperature of the wafer through the aperture of the probe card using the infra-red thermal sensor while testing the DUT.

18. The method of claim 17, comprising:
in response to the temperature of the wafer being within the acceptance range:
programming the DUT according to the temperature of the wafer.

19. The method of claim 15, comprising:
sensing the temperature of the wafer through the aperture of the probe card using the infra-red thermal sensor while testing the DUT.

20. The method of claim 15, comprising:
in response to the temperature of the wafer being within an acceptance range:
programming the DUT according to the temperature of the wafer.

* * * * *